(12) United States Patent
Kajiyama

(10) Patent No.: US 7,598,577 B2
(45) Date of Patent: Oct. 6, 2009

(54) MAGNETIC MEMORY DEVICE

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1306 days.

(21) Appl. No.: 10/383,632

(22) Filed: Mar. 10, 2003

(65) Prior Publication Data

US 2003/0183889 A1    Oct. 2, 2003

(30) Foreign Application Priority Data

Mar. 28, 2002 (JP) .............................. 2002-093091

(51) Int. Cl.
*H01L 29/72* (2006.01)

(52) U.S. Cl. ........................ 257/421; 257/618; 365/137; 365/158; 365/173

(58) Field of Classification Search ................. 257/421, 257/618; 365/137, 158, 173
See application file for complete search history.

(56) References Cited

U.S. PATENT DOCUMENTS

2002/0149962 A1 * 10/2002 Horiguchi .................... 365/173

FOREIGN PATENT DOCUMENTS

JP    2000-163950    6/2000

* cited by examiner

*Primary Examiner*—Edward Wojciechowicz
(74) *Attorney, Agent, or Firm*—Oblon, Spivak, McClelland, Maier & Neustadt, L.L.P.

(57) ABSTRACT

A magnetic memory device comprises magneto-resistance elements each including a cylindrical fixed magnetization layer, an insulating film which covers an external surface of the fixed magnetization layer, and a free magnetization layer which faces the fixed magnetization layer through the insulating film and covers a surface of the insulating film, wherein a magnetization direction of the fixed magnetization layer is parallel to a central axis direction of the cylinder.

16 Claims, 8 Drawing Sheets

MAGNETIC MEMORY DEVICE

CROSS-REFERENCE TO RELATED APPLICATIONS

This application is based upon and claims the benefit of priority from the prior Japanese Patent Application No. 2002-93091, filed Mar. 28, 2002, the entire contents of which are incorporated herein by reference.

BACKGROUND OF THE INVENTION

1. Field of the Invention

The present invention relates to a magnetic memory device, and particularly relates to a magnetic memory device having a tunneling magneto-resistance element.

2. Description of the Related Art

In the magnetic memory device of the prior art, the tunneling magneto-resistance element (hereinafter referred to as "TMR element") is used as a memory cell. However, in the conventional TMR element, since a shape of the memory cell is formed in a rectangular plane, an irregular magnetic domain occurs in a periphery of the rectangular plane and a magneto-resistance ratio (MR ratio) is decreased.

A long side of the TMR element is formed so as to be particularly larger than a short side and a direction of the long side of the TMR element is formed so as to be parallel to a magnetization direction, in order that an effect of demagnetizing field is avoided to suppress the occurrence of the irregular magnetic domain and the MR ratio is improved. Consequently, miniaturization of the magnetic memory device is prevented.

BRIEF SUMMARY OF THE INVENTION

As described above, the conventional magnetic memory device employing the conventional TMR element which includes the rectangular plane having the large long side, is not suitable for the miniaturization or integration. In view of the foregoing, it is an object of the invention to provide a magnetic memory device having a TMR element suitable for the miniaturization and the integration.

A magnetic memory device comprises magneto-resistance elements each including: a cylindrical fixed magnetization layer; an insulating film which covers an external surface of the fixed magnetization layer; and a free magnetization layer which faces the fixed magnetization layer through the insulating layer and covers a surface of the insulating layer, wherein a magnetization direction of the fixed magnetization layer is parallel to a central axis direction of the cylinder.

DETAILED DESCRIPTION OF THE INVENTION

Preferred embodiments of the invention will be described in detail below referring to the accompanying drawings.

First, in order to contrast the magnetic memory device of the prior art with characteristics of the invention, a schematic example of the magnetic memory device employing a rectangular plane type TMR element of the prior art will be described by using FIGS. 13 and 14.

Figure 13:
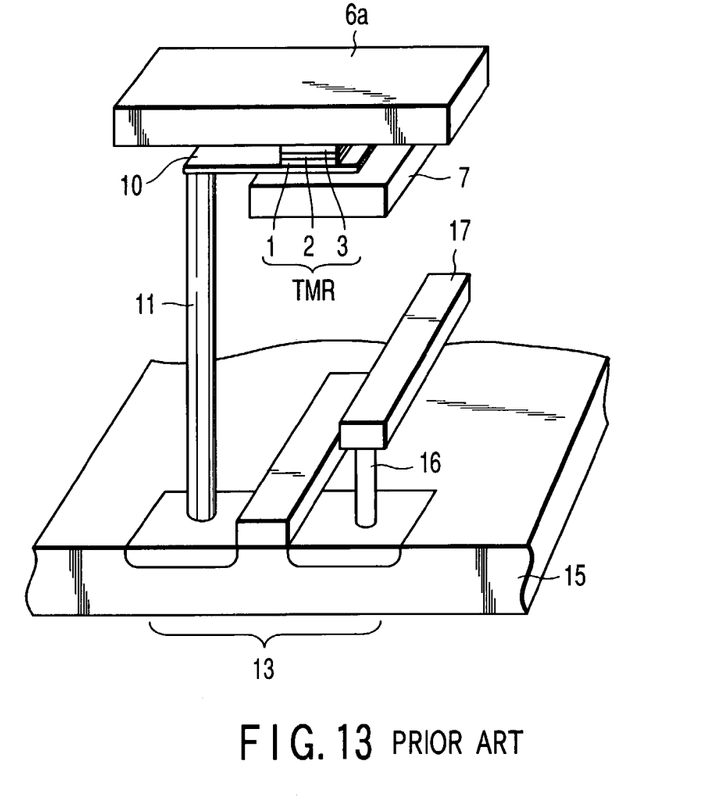
FIG. 13 is a perspective view of a magnetic memory device of a prior art.

FIG. 13 shows a structure of a one transistor/one TMR type magnetic memory device of the prior art.

The above-described magnetic memory device includes the rectangular TMR element having a fixed magnetization layer 1, a tunnel insulating film 2, and a free magnetization layer 3, a common read/write wiring layer (bit line) 6a connected electrically to the free magnetization layer 3 of the TMR element, a read electrode 10 connected electrically to the fixed magnetization layer 1 of the TMR element, a write wiring layer (word line) 7 arranged in the vicinity of the outside of the TMR element, a contact plug 11 connected between the read electrode 10 and one of current electrodes (source or drain) of a read/write selection transistor 13, a contact plug 16 connected to the other current electrode (source or drain region) of the read/write selection transistor 13, and a wiring layer 17 connected to the contact plug 16 and supplying read/write current.

The fixed magnetization layer 1 is a reference layer of the TMR element, and functions to arrange the magnetization direction of the free magnetization layer 3, facing the fixed magnetization layer 1 through the tunnel insulating film 2, to the larger side of the rectangular plane type TMR element. Thus, the magnetization direction of the free magnetization layer 3 is arranged to the larger side by the fixed magnetization layer 1, and the magnetization of the free layer 3 is reversed by using a magnetic field generated by a current flowing through the write wiring layer, so that the magnetic inversion is read as a change in the tunnel current flowing through the tunnel insulating film 2, that is, as the MR ratio of the TMR element.

As described above, in the rectangular TMR element of the prior art, because the irregular magnetic domain occurs in the periphery of the TMR element and an area ratio of the periphery of the TMR element to the total area is increased with miniaturizing the TMR element, the MR ratio will be remarkably decreased with miniaturizing the TMR element and read margin of the magnetic memory device will be decreased. If the rectangular TMR element having the larger side is used in order to decrease the occurrence of the irregular magnetic domain influenced by the demagnetizing field, it will be necessary to provide the wiring layer and the electrode in accordance with the dimension of the larger side. At the result, high densification or the large-scale integration of the magnetic memory device will be greatly restricted.

Figure 14:
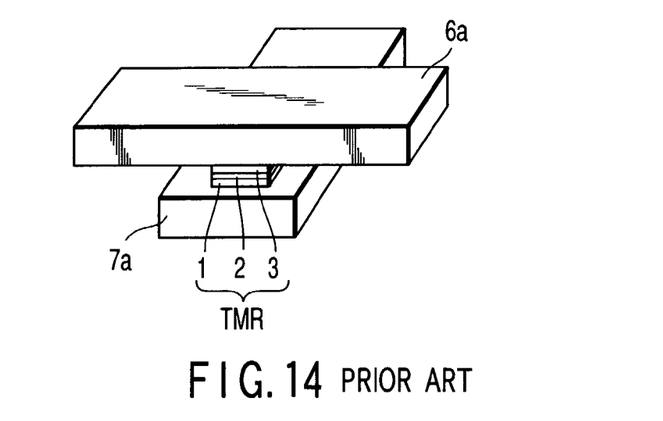
FIG. 14 is a perspective view of another magnetic memory device of the prior art.

FIG. 14 shows a main part of the conventional magnetic memory device which is formed as a cross point type by using the rectangular TMR element. The main part of the magnetic memory device shown in FIG. 14 includes the rectangular TMR element having the fixed magnetization layer 1, the tunnel insulating film 2, and the free magnetization layer 3, the common read/write wiring layer (bit line) 6a connected electrically to the free magnetization layer 3, and a common read/write wiring layer 7a connected electrically to the fixed magnetization layer 1.

A wiring structure can be simplified to achieve the densification of the TMR element array to a certain extent by sharing all the write and read wiring layers. However, the sufficient densification of the magnetic memory device can not be achieved because it is necessary to use the thick wiring layers corresponding to the dimension of the larger side of the rectangular TMR element.

FIRST EMBODIMENT

A structure of a TMR element according to a first embodiment and a method of manufacturing the TMR element will be described using FIGS. 1 and 2.

Figure 1:
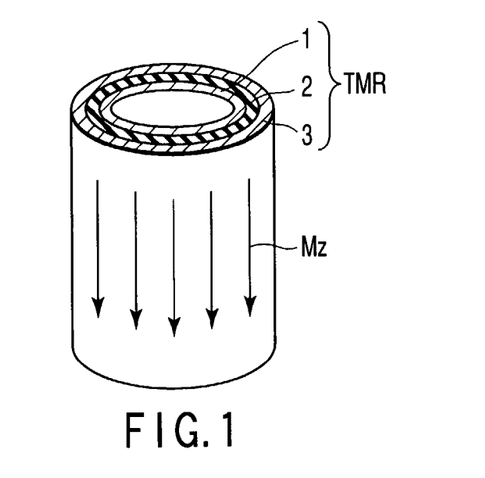
FIG. 1 is a perspective view of a cylindrical TMR element according to a first embodiment.

FIG. 1 is a perspective view showing the main part of the TMR element, which is provided in the shape of a cylinder by stacking a free magnetization layer 3 on a cylindrical fixed magnetization layer 1 through a tunnel insulating film 2.

Arrows in FIG. 1 show magnetization $M_Z$ of the free magnetization layer 3, which is fixed in the axial direction of the cylinder perpendicular to a substrate surface by using the fixed magnetization layer 1. Binary information can be stored in such a manner that the magnetization $M_Z$ of the free magnetization layer is reversed with the magnetic field generated by current of the write wiring layer. Therefore, in the cylindrical type TMR element extended in the axial direction, the MR ratio can be significantly improved, because the irregular magnetic domain does not occur in the periphery of the larger side, compared with the rectangular TMR element of the prior art having the larger side.

Since the cylindrical TMR element is formed to be long in the axial direction, the effect of demagnetization field is minimized and occurrence of the irregular magnetic domain is also minimized in the vicinity of an end portion of the cylinder, thereby further improving the MR ratio. In FIG. 1, the axial direction is reduced for easy visibility of a sectional structure of the cylindrical TMR element, and an internal structure in a central part of the cylinder is abbreviated.

The sectional structure of the cylindrical TMR element and the method of manufacturing the same will be concretely described with FIGS. 2A to 2D.

Figure 2A:
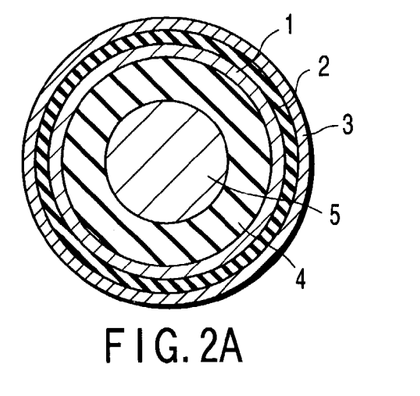
FIGS. 2A to 2D are sectional views of the TMR element according to the first embodiment.

The cylindrical TMR element shown in FIG. 2A comprises a plug 5 with circular cross section, which forms the central axis of the cylinder, an interlevel insulator 4 formed on a surface of the plug 5, the fixed magnetization layer 1 formed on the interlevel insulator 4, the tunnel insulating film 2 formed on the fixed magnetization layer 1, and the free magnetization layer 3 formed on the tunnel insulating film 2. As described later, the plug 5 is used to write information in the free magnetization layer 3.

Figure 2B:
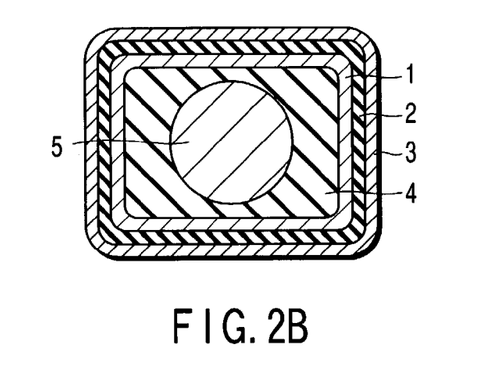

A cylindrical TMR element shown in FIG. 2B includes the interlevel insulator 4 with the almost rectangular cross section, the fixed magnetization layer 1 with almost rectangular cross section, the tunnel insulating film 2, and the free magnetization layer 3. Other parts are formed in the similar way to that of FIG. 2A. At this point, in case that the plug 5 is provided in the form of the almost rectangular cross section, the interlevel insulator 4, the fixed magnetization layer 1, the tunnel insulating film 2, and the free magnetization layer 3 may be successively stacked on the plug 5, thereby obtaining the same write function.

Figure 2C:
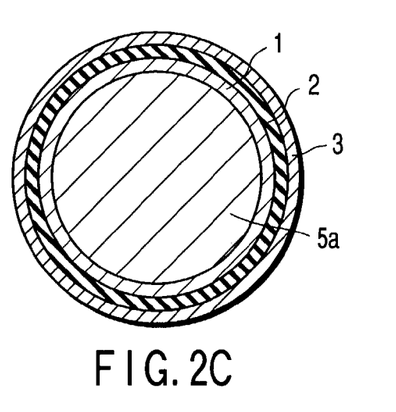

In the cylindrical TMR element shown in FIG. 2C, unlike FIG. 2A, there is no interlevel insulator 4 between the plug 5a and the fixed magnetization layer 1. That is to say, the plug 5a and the fixed magnetization layer 1 are electrically connected in the cylindrical TMR element shown in FIG. 2C. As shown later, because the plug 5a also has a read/write function, it is indicated as a common read/write plug in FIG. 2C in order to distinguish the plug 5a from the plug 5 in FIGS. 2A and 2B.

Figure 2D:
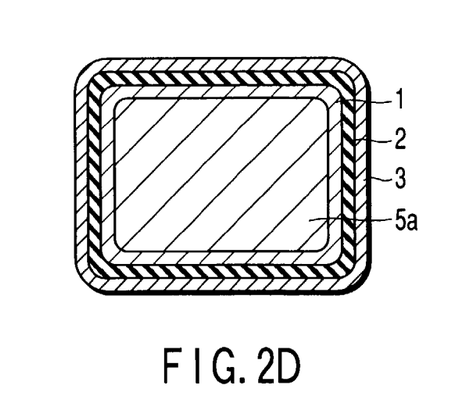

In the cylindrical TMR element shown in FIG. 2D, unlike FIG. 2B, the plug 5a has the almost rectangular cross section, and the interlevel insulator 4 is abbreviated to connect electrically the plug 5a and the fixed magnetization layer 1, thereby providing the common read/write plug 5a.

In the above-described cylindrical TMR elements, the fixed magnetization layer 1 is formed on the internal surface of the cylindrical tunnel insulating film 2 and the free magnetization layer 3 is provided to face the fixed magnetization layer 1 through the tunnel insulating film 2 and to cover the external surface of the tunnel insulating film 2. However, by reversing the stack order, the free magnetization layer 3 may be formed on the internal surface of the cylindrical tunnel insulating film 2, and the fixed magnetization layer 1 may be formed to face the free magnetization layer 3 through the cylindrical tunnel insulating film 2 and to cover the external surface of the tunnel insulating film 2.

SECOND EMBODIMENT

A magnetic memory device according to a second embodiment, in which the cylindrical TMR elements are integrated on a silicon substrate, will be described with FIG. 3.

Figure 3:
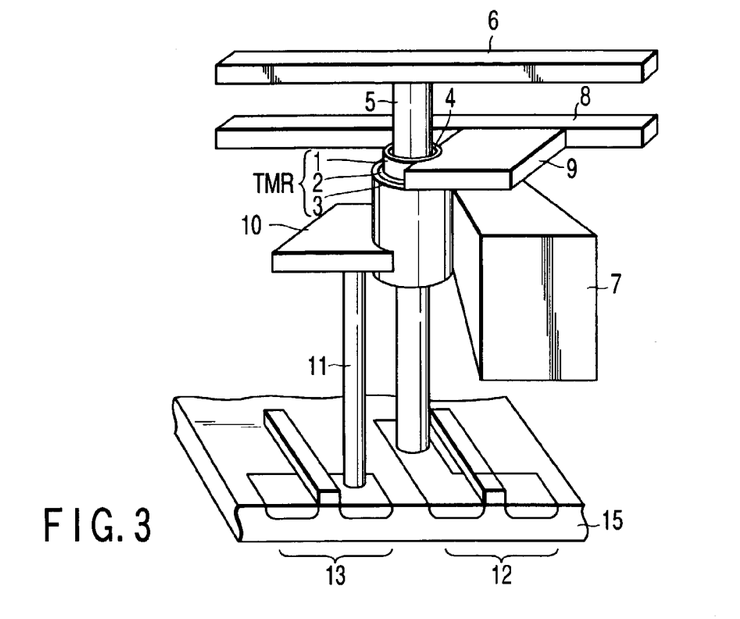
FIG. 3 is a perspective view of a magnetic memory device according to a second embodiment.

The magnetic memory device shown in FIG. 3 includes the cylindrical TMR element having the fixed magnetization layer 1, the tunnel insulating film 2 and the free magnetization layer 3, the interlevel insulator 4 (not shown), the write plug 5 provided inside the cylindrical TMR element, a write wiring layer (bit line) 6 connected to one end of the write plug 5, the write wiring layer (word line) 7 which is provided outside the cylindrical TMR element and parallel to a silicon substrate 15, a read electrode 9 which is electrically connected to the fixed magnetization layer 1 through a removed part fitted to a side surface of the fixed magnetization layer 1 and which is parallel to the silicon substrate 15, a read wiring layer 8 connected to the read electrode 9, the read electrode 10 which is electrically connected to the free magnetization layer 3 through a removed part fitted to a side surface of the free magnetization layer 3 and which is parallel to the silicon substrate 15, the read plug 11 whose one end is connected to the read electrode 10, a write selection transistor 12 formed in the silicon substrate 15, and the read transistor 13 formed therein.

As described above, the read electrode 9 is electrically connected so as to be fitted to the side surface of the fixed magnetization layer 1 to be removed partially, and the read electrode 10 is electrically connected so as to be fitted to the side surface of the free magnetization layer 3 to be removed partially, which enables the magnetic memory device to be easily manufactured because of the use of a self-aligned manufacturing process.

The other end of the write plug 5 is connected to one (source or drain region) of current terminals of the write selection transistor 12, and the other end of the read plug 11 is connected to one (source or drain region) of current terminals of the read selection transistor 13.

If a wiring system in which the read/write current can be secured is formed, it is not always limited to the structure in which the other end of the write plug 5 and read plug 11 are connected to the write selection transistor 12 and the read selection transistor 13 shown in FIG. 3. This is common to all the embodiments described below.

The fixed magnetization layer 1 is the reference layer of the TMR element, and the fixed magnetization layer 1 serves to arrange the magnetization direction of the free magnetization layer 3, formed to face the fixed magnetization layer 1 through the tunnel insulating film 2, to the axial direction of the cylindrical TMR element. Thus, the magnetization direction of the free magnetization layer 3 is arranged to the axial direction of the cylinder by the fixed magnetization layer 1, and the magnetization of the free magnetization layer 3 is reversed by using the magnetic field generated by current of the write plug 5 connected to the write wiring layer 6 and the write wiring layer 7, so that the magnetic inversion is read as the change in the tunnel current flowing through the tunnel insulating film 2, that is to say, the MR ratio of the cylindrical TMR element is read through the read wiring layer 8, the read electrodes 9 and 10, the read plug 11, and the read selection transistor 13.

By using the cylindrical TMR element extended in the axial direction, the long side direction of the element is placed perpendicular to the surface of the silicon substrate, compared with the rectangular TMR element of the prior art. Therefore, since the area efficiency is significantly improved and the occurrence of the irregular magnetic domains is diminished in the periphery, the high MR ratio can be maintained even if the TMR element is miniaturized, and the sufficient read/write operational margin can be secured as the largely integrated magnetic memory device.

Though the interlevel insulator 4 is abbreviated in FIG. 3, it is produced so as to embed a whole wiring structure on the silicon substrate, because the magnetic memory device is manufactured with an integrated circuit technique. The cylindrical TMR element can be easily introduced into the magnetic memory device by changing a formation process of the plug.

THIRD EMBODIMENT

A third embodiment will be described with FIG. 4. The magnetic memory device includes the common read/write plug 5a provided inside the cylindrical TMR element and connected electrically to the fixed magnetization layer 1, a common read/write wiring layer 6a connected to one end of the plug 5a, the write wiring layer 7 which is provided outside the cylindrical TMR element and is parallel to the silicon substrate 15, the read electrode 10 which is electrically connected to the free magnetization layer 3 through the removed part fitted to the side surface of the free magnetization layer 3 and is parallel to the silicon substrate 15, the read plug 11 whose one end is connected to the read electrode 10, the write selection transistor 12 formed on the silicon substrate 15, and the read transistor 13.

The other end of the common read/write plug 5a is connected to one of current terminals of the write selection transistor 12, and the other end of the read plug 11 is connected to one of current terminals of the read selection transistor 13.

The magnetization of the free magnetization layer 3 is reversed by using the magnetic field generated by current of the plug 5a connected to the common read/write wiring layer 6a and the write wiring layer 7, so that the change in the tunnel current of the tunnel insulating film 2 by the magnetic inversion is read through the plug 5a connected to the common read/write wiring layer 6a, the read electrode 10, the read plug 11, and the read selection transistor 13.

In the third embodiment, though the write current flows through the fixed magnetization layer 1 because the plug 5a is connected to the fixed magnetization layer 1, there is no influence on the write margin of the magnetic memory device because the write current does not flow through the free magnetization layer 3 where the magnetization is reversed. Accordingly, when the plug 5a is electrically connected to the fixed magnetization layer 1 and used as the common read/write electrode, the manufacturing process of the magnetic memory device is simplified and the number of leads are decreased, which allows the further high integration to be achieved, compared with the second embodiment.

FOURTH EMBODIMENT

A fourth embodiment will be described with FIG. 5. The magnetic memory device includes the common read/write plug 5a provided inside the cylindrical TMR element and connected electrically to the fixed magnetization layer 1, the common read/write wiring layer 6a connected to one end of the plug 5a, a common read/write wiring layer 7a which is provided outside the cylindrical TMR element, connected electrically to the free magnetization layer 3 through the removed part fitted to the side surface of the free magnetization layer 3, and parallel to the silicon substrate 15, a read/write electrode 10a which is similarly provided outside the cylindrical TMR element, electrically connected to the free magnetization layer 3 through a removed part fitted to the side surface of the free magnetization layer 3, and parallel to the silicon substrate 15, and the write selection transistor 12 formed on the silicon substrate 15.

The other end of the common read/write plug 5a is connected to one of current terminals of the write selection transistor 12.

The magnetization of the free magnetization layer 3 is reversed by the magnetic field generated by the current of the plug 5a connected to the common read/write wiring layer 6a and the common read/write wiring layers 7a and 10a, so that the change in the tunnel current of the tunnel insulating film 2 by the magnetic inversion is read through the plug 5a connected to the common read/write wiring layer 6a, the common read/write wiring layers 7a and 10a.

In the fourth embodiment, in the case of writing information in the free magnetization layer 3 of the cylindrical TMR element, since current in the reverse direction flows through the pair of common write/read wiring layers 7a and 10a parallel to each other, the magnetic field generated by the current is strengthened each other and there is an effect of uniformizing the writing magnetic field to the free magnetization layer 3. Furthermore, since the change in the tunnel current is also read from both sides of the free magnetization layer 3 by using the common read/write wiring layers 7a and 10a, according to the fourth embodiment, the one transistor/ one TMR type integrated magnetic memory device having the large read/write margin can be obtained.

FIFTH EMBODIMENT

Figure 6:
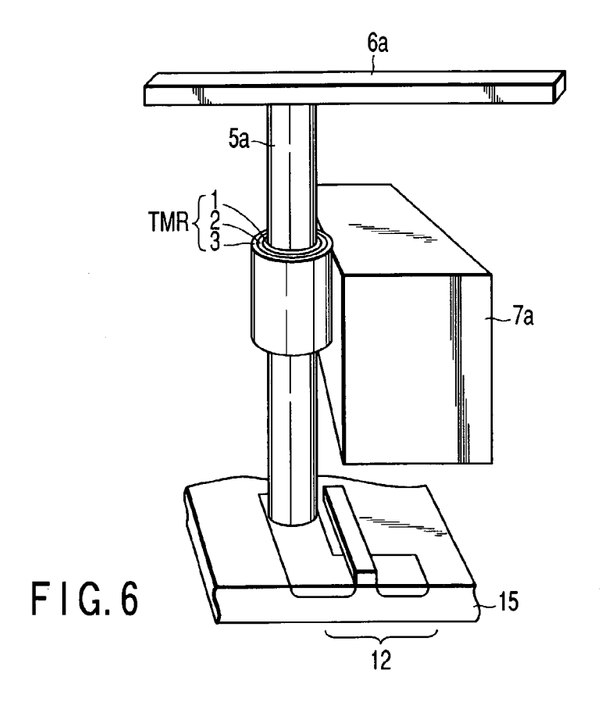
FIG. 6 is a perspective view of a magnetic memory device according to a fifth embodiment.

A fifth embodiment of the invention will be described with FIG. 6. The magnetic memory device includes the common read/write plug 5a provided inside the cylindrical TMR element and connected electrically to the fixed magnetization layer 1, the common read/write wiring 7a connected to one end of the plug 5a, the common read/write wiring 7a which is provided outside the cylindrical TMR element, connected electrically to the free magnetization layer 3 through a removed part fitted to a side surface of the free magnetization layer 3, and parallel to a silicon substrate 15, and the write selection transistor 12 formed on the silicon substrate 15.

The other terminal of the common read/write plug 5a is connected to one of current terminals of the write selection transistor 12.

The magnetization of the free magnetization layer 3 is reversed by using the magnetic field generated by the current of the plug 5a connected to the common read/write wiring layer 6a and the common read/write wiring layer 7a, so that the change in the tunnel current of the tunnel insulating film 2, which is caused by the magnetic inversion, is read through the common read/write wiring layer 7a and the plug 5a.

Figure 12:
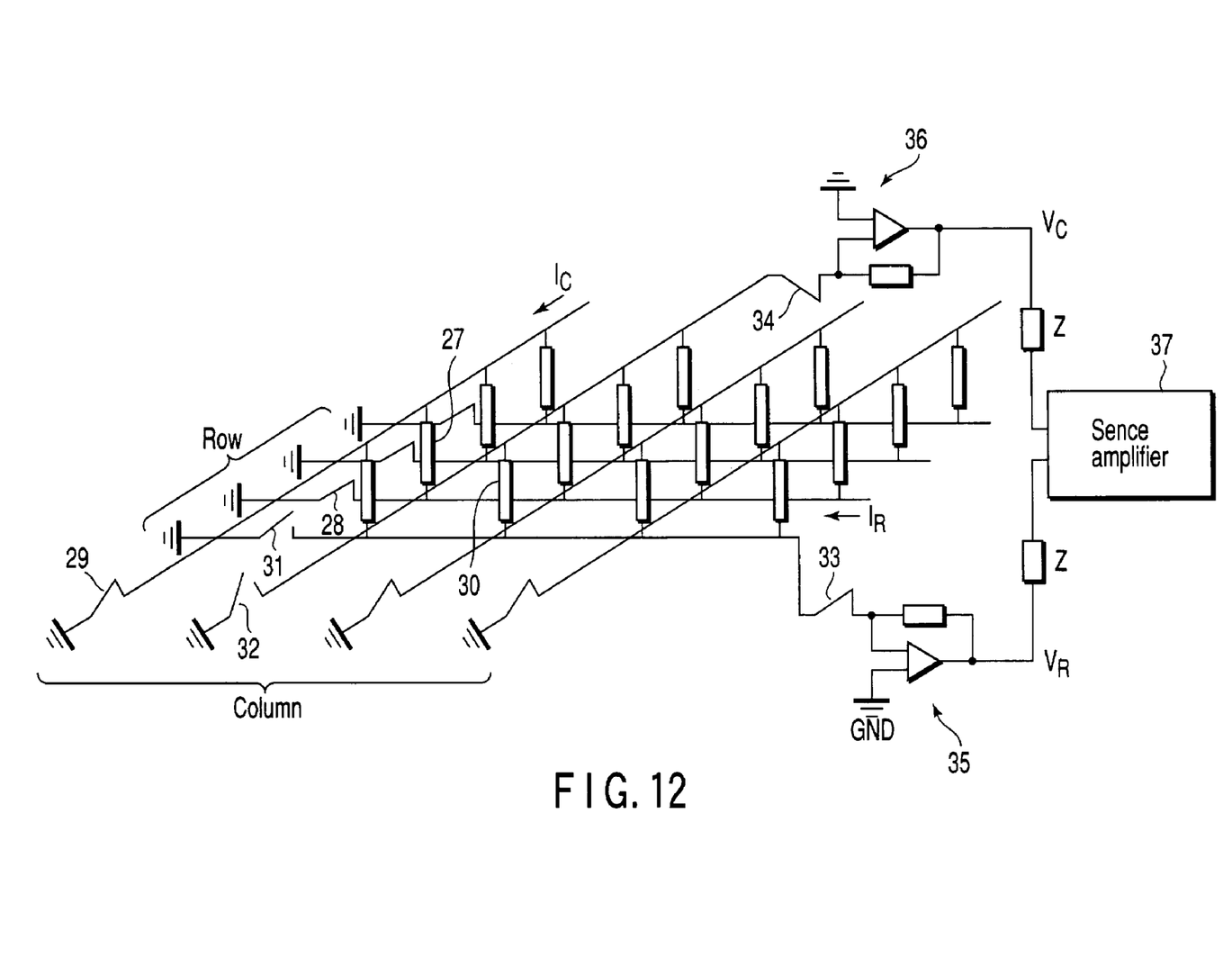
FIG. 12 is a schematic diagram of another cell array of the TMR element according to the seventh embodiment.

The magnetic memory device of the fifth embodiment corresponds to the cross point type which is described with FIG. 12. The one transistor/one TMR type integrated magnetic memory device can be obtained by simplifying the wiring structure.

SIXTH EMBODIMENT

A sixth embodiment of the invention will be described with FIGS. 7 to 10. This embodiment is modification of the write wiring layer 7 and the read/write wiring layer 7a in the second to fifth embodiments shown in FIGS. 3 to 6.

Figure 7:
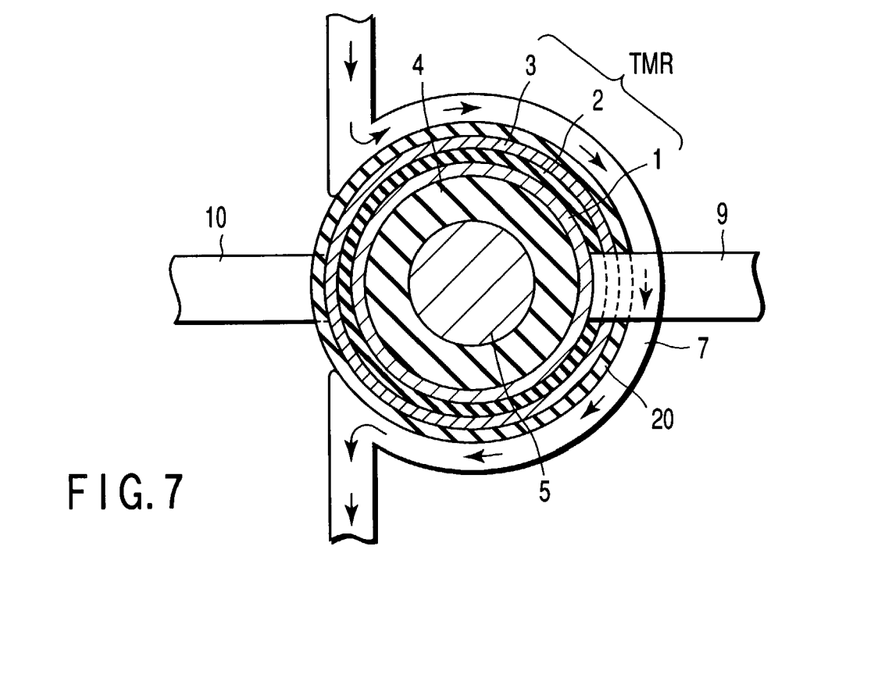
FIG. 7 is a schematic diagram of a loop-shaped write wiring of a TMR element according to a sixth embodiment.

The modification of the write wiring layer 7 in the second embodiment shown in FIG. 3 will be described with FIG. 7. The write wiring layer 7 shown in FIG. 7 is in contact with the external surface of an interlevel insulator 20 so as to be fitted to the external surface of the cylindrical TMR element covered therewith. In other wiring structures, similarly to the magnetic memory device according to the second embodiment, the read electrode 9 is electrically connected to the fixed magnetization layer 1 and the read electrode 10 is electrically connected to the free magnetization layer 3.

As shown in FIG. 7, when the loop-shaped write wiring layer 7 parallel to the silicon substrate is arranged and the write current flows as shown by arrows, the magnetic field in a z-axis direction generated by the write current is uniformized compared with the linear write wiring layer 7 shown in FIG. 3, which allows magnetic coupling with the free magnetization layer 3 to be increased. As a result, the magnetic memory device having the large write margin can be realized.

Figure 8:
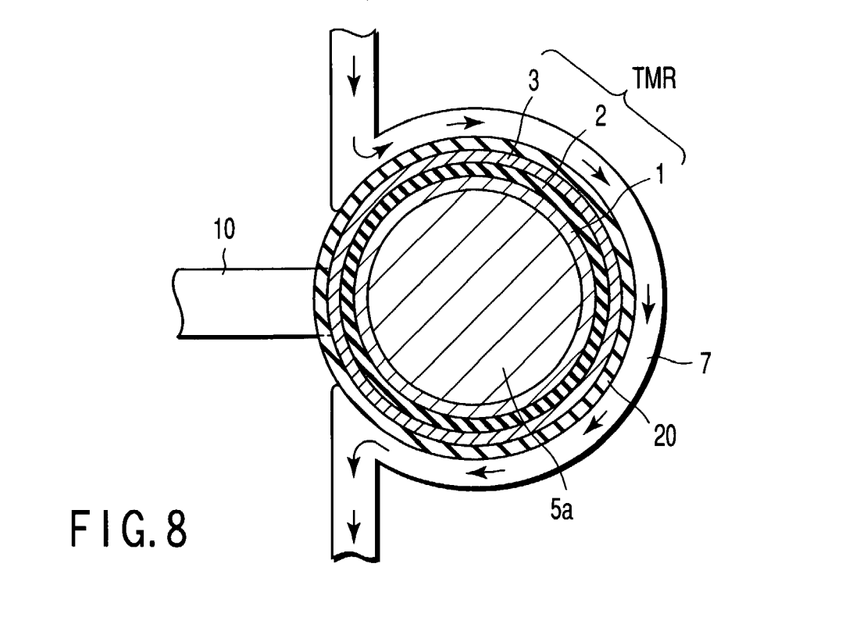
FIG. 8 is another schematic diagram of the loop-shaped write wiring of the TMR element according to the sixth embodiment.

The modification of the write wiring layer 7 in the third embodiment shown in FIG. 4 will be described with FIG. 8. The write wiring layer 7 comes in contact with the external surface of the interlevel insulator 20 so as to be fitted to the shape of the external surface of the cylindrical TMR element covered therewith. In other wiring structures, similarly to the magnetic memory device according to the third embodiment shown in FIG. 4, the read electrode 10 is electrically connected to the free magnetization layer 3 and the common read/write plug 5a is electrically connected the fixed magnetization layer 1.

Similarly to FIG. 7, when the loop-shaped write wiring layer 7 parallel to the silicon substrate is arranged and the write current flows as shown by arrows, the magnetic memory device having the large write margin can be realized.

The modification of the common read/write wiring layers 7a and 10a in the fourth embodiment shown in FIG. 5 will be described with FIG. 9. The common read/write wiring layers 7a and 10a are contacted to the external surface of the free magnetization layer 3 so as to be fitted to the shape of the external surface of the cylindrical TMR element. In other wiring structures, similarly to the magnetic memory device according to the fourth embodiment shown in FIG. 5, the common read/write plug 5a is electrically connected to the fixed magnetization layer 1.

Figure 5:
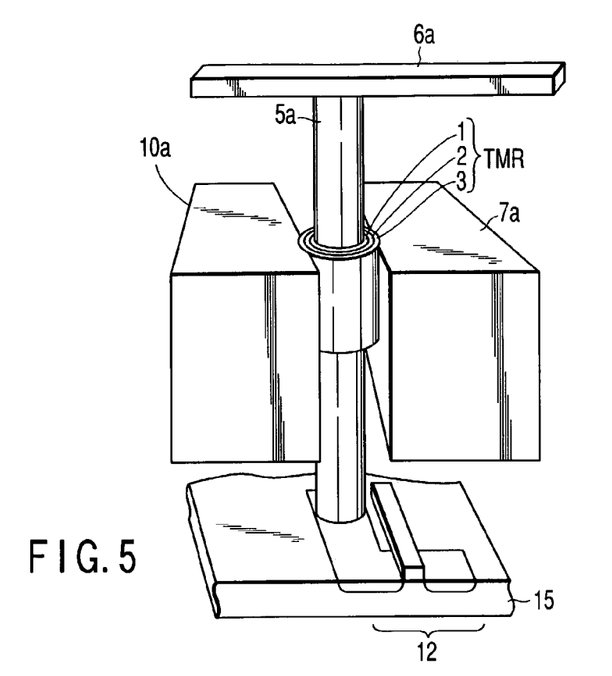
FIG. 5 is a perspective view of a magnetic memory device according to a fourth embodiment.
Figure 9:
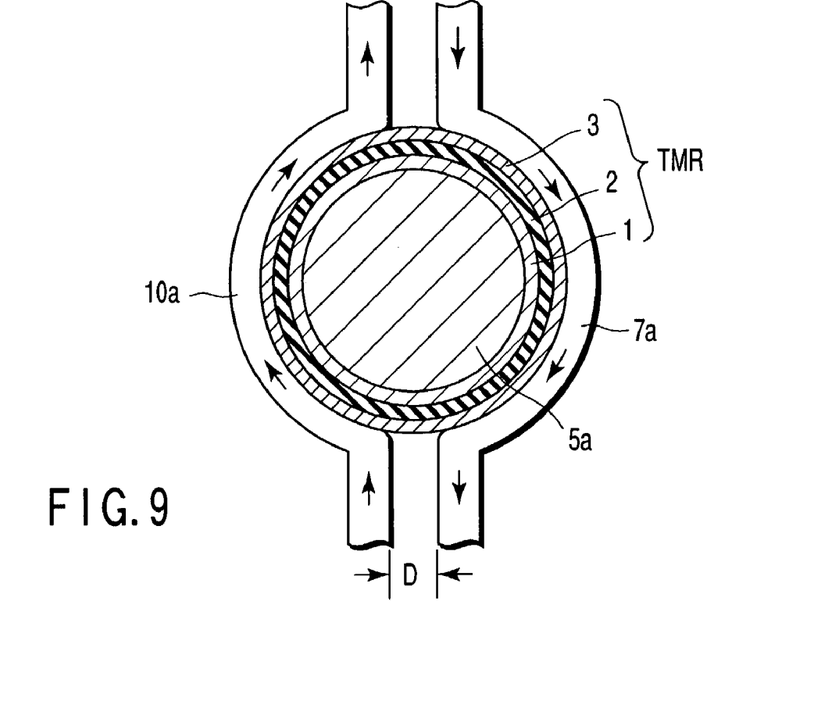
FIG. 9 is another schematic diagram of the loop-shaped write wiring of the TMR element according to the sixth embodiment.

As shown in FIG. 9, when the pair of loop-shaped read/write leads 7a and 10a is arranged to be parallel to the silicon substrate and the write current in an opposite direction flows mutually as shown by arrows, the magnetic field in the z-axis direction generated by the write current is uniformized compared with the pair of linear read/write leads 7a and 10a shown in FIG. 5, which allows the magnetic coupling with the free magnetization layer 3 to be increased. As a result, the magnetic memory device having the large write margin can be realized.

Potential difference is generated in a gap D by the resistance of the common read/write wiring layers 7a and 10a, which enables the current in a reverse direction to flow through the free magnetization layer 3 in the gap D. However, since electric conductivity of the free magnetization layer 3 is sufficiently small, a decrease in the write margin of the magnetic memory device caused by the current in the reverse direction can be neglected.

Therefore, generally as the gap D is decreased, the magnetic field in the z-axis direction generated by the write current is uniformized to increase the magnetic coupling with the free magnetization layer 3, which allows the one transistor/one TMR type integrated magnetic memory device having the large write margin to be realized.

The modification of the common read/write wiring layer 7a in the fifth embodiment shown in FIG. 6 will be described with FIG. 10. The common read/write wiring layer 7a is connected to the external surface of the free magnetization layer 3 so as to be fitted to the shape of the external surface of the cylindrical TMR element including the free magnetization layer 3. In other wiring structures, similarly to the magnetic memory device according to the fifth embodiment shown in FIG. 6, the common read/write plug 5a is electrically connected to the fixed magnetization layer 1.

Figure 10:
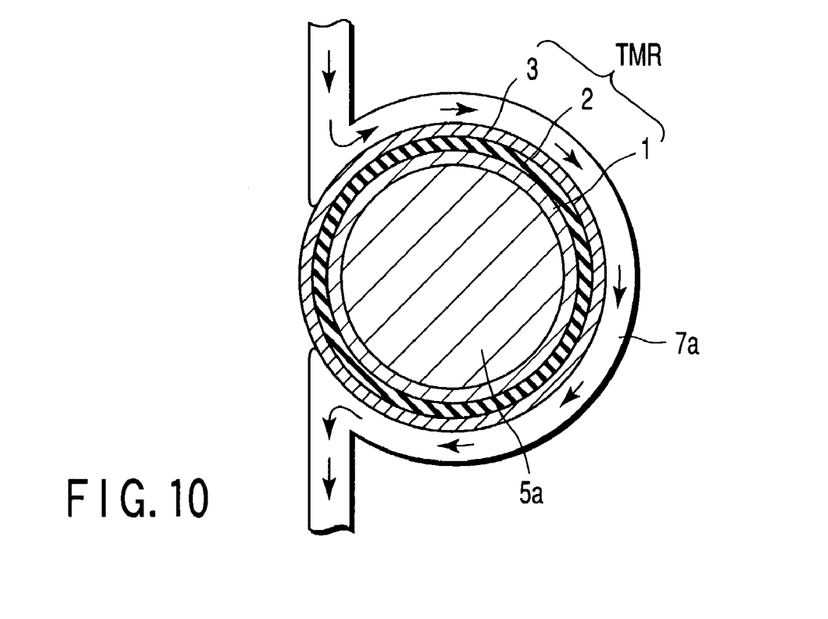
FIG. 10 is another schematic diagram of the loop-shaped write wiring of the TMR element according to the sixth embodiment.

As shown in FIG. 10, when the loop-shaped common read/write wiring layer 7a parallel to the silicon substrate is arranged and the write current flows as shown by arrows, the one transistor/one TMR type integrated magnetic memory device having the large write margin can be realized.

SEVENTH EMBODIMENT

A seventh embodiment will be described with FIGS. 11 and 12. In the magnetic memory device having the TMR elements, an outline of read/write operation in the case where the cylindrical TMR elements is incorporated in a configuration of the cell array of one transistor/one TMR type or the cross point type and an advantage generated in the connection of a sense amplifier and the cylindrical TMR elements, particularly, during the read operation of the cylindrical TMR elements will be described in detail.

Figure 11:
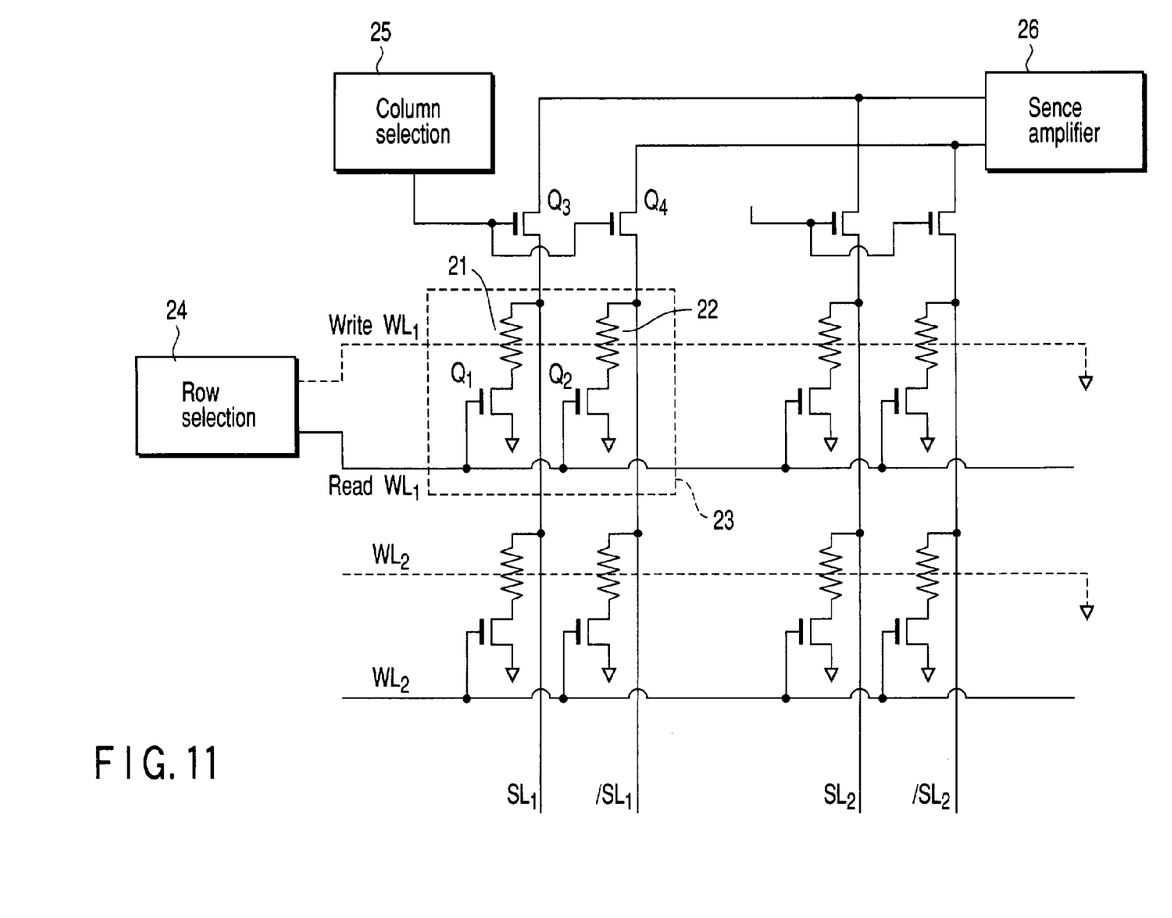
FIG. 11 is a schematic diagram of a cell array of a TMR element according to a seventh embodiment.

FIG. 11 shows the configuration of the one transistor/one TMR type cell array. In a region 23 surrounded by a dot line, a first cell includes a TMR element 21 indicated by a resistance and a cell transistor $Q_1$ connected in series. A second cell includes a TMR element 22 and a cell transistor $Q_2$ connected in series. The first and second cells are connected between a read word line $WL_1$ and a pair of column lines (bit line) $SL_1$ and $/SL_1$. The cell array includes a row selection circuit 24, a column selection circuit 25, column selection transistors $Q_3$ and $Q_4$, and a sense amplifier 26.

One of terminals of the TMR element 21 and one of terminals of the TMR element 22 (for example, plug 5a in FIG. 4) are connected to the column selection lines $SL_1$ and $/SL_1$ respectively, while the other terminals of the TMR elements 21 and 22 (for example, electrode 10 in FIG. 4) are grounded through the cell transistors $Q_1$ and $Q_2$.

First of all, the write operation in the TMR elements 21 and 22 will be described. The write operation is performed in such a manner that the write current flows through the write word line $WL_1$ of the dot line and a pair of column selection lines $SL_1$ and $/SL_1$ selected by the column selection transistors $Q_3$ and $Q_4$.

Figure 4:
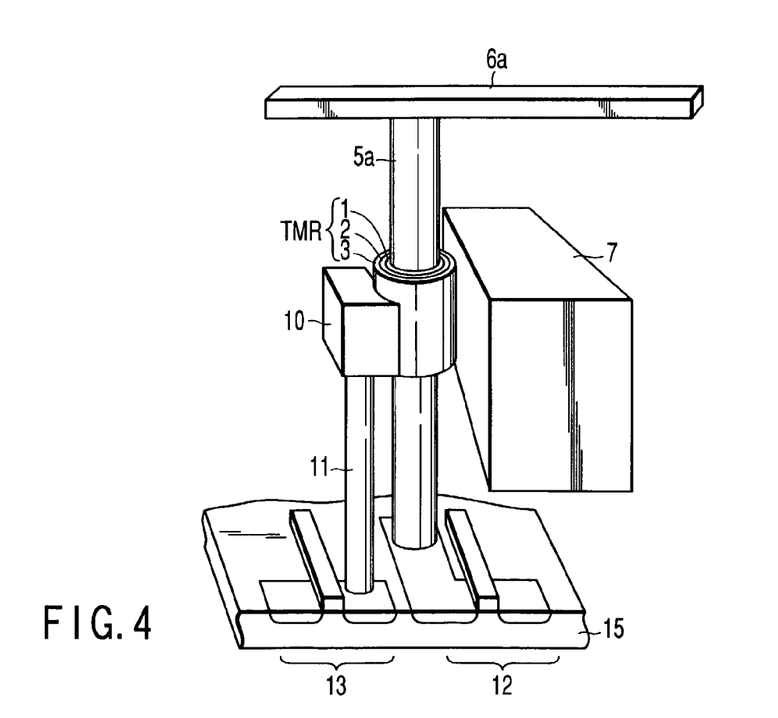
FIG. 4 is a perspective view of a magnetic memory device according to a third embodiment.

The write word line $WL_1$ of the dot line corresponds to the write wiring layer 7 shown in FIG. 4, and one of the column selection transistors $Q_3$ and $Q_4$ corresponds to the write selection transistor 12 shown in FIG. 4. Accordingly, the column selection line $SL_1$ perpendicular to the write word line $WL_1$ in FIG. 11 is connected to the plug 5a of the TMR element in FIG. 4.

In the case of the write operation, the magnetization of a pair of TMR elements is induced in such a manner that the write current flows through the write word line $WL_1$ selected by the row selection circuit 24 and the pair of column selection lines $SL_1$ and $/SL_1$ selected by the column selection circuit 25. At this point, the sense amplifier 26 is separated by a switch (not shown) of an input unit.

In the case of the read operation, the minute current flows through the pair of column selection lines $SL_1$ and $/SL_1$, so that a change in the resistance generated between a pair of TMR elements is read with the sense amplifier 26. At this point, the plug 5a of FIG. 4 which is electrically connected to the whole internal surface of the TMR element is connected to the sense amplifier 26 of FIG. 11.

Next, the cell array configuration of the cross point type TMR elements including the above-described TMR elements will be described with FIG. 12. In FIG. 12, the selection of the row and the column is shown by turning on/off a switch whose one of terminals is grounded. A sense amplifier 37 has input buffers 35 and 36.

The write operation will be described first. When memory data is written in a TMR element 27, the TMR element 27 is separated from the sense amplifier 37, a switch 28 of a row side is turned on, and the write current $I_R$ flows through one of word lines connected to the switch 28. A switch 29 of a column side is turned on, and the write current $I_C$ flows through one of word lines connected to the switch 29. Consequently, the memory data is written in the TMR element 27.

When memory data of a TMR element 30 is read, the change in the resistance of the TMR element 30 generated by the magnetic inversion is detected in such a manner that a switch 30 is turned off, the word line connected to one of terminals of the TMR element 30 is separated from the ground, a switch 32 is turned off, the bit line connected to the other terminal of the TMR element 30 is separated from the ground, these word line and the bit line are connected to the sense amplifier 37 by using switches 33 and 34, and the minute read current flows through the TMR element 30. The connection or the separation between the sense amplifier 37 and the word line and the bit line is performed by a switch which is not shown.

Because the plug 5a of the TMR element, which is electrically connected to the whole internal surface, is connected to either the word line or the bit line, even in the cross point type circuit, the plug 5a of the TMR element is connected to the sense amplifier in the same way as that in FIG. 11.

As described above, the plug 5a of the cylindrical TMR element has advantages that an electrically contact area is large and a required area is small as the current terminal for conducting the minute read current of the TMR element to the sense amplifier.

In the cylindrical TMR element, when the margin is taken so that the external surface of the element is fitted to only the both edges of the cylinder, almost the front surface can be used as the current terminal facing the internal surface through the tunnel insulating film. Accordingly, the detection of the read current can be carried out with the high MR ratio and high sensitivity.

On the other hand, the rectangular TMR element of the prior art, for example, even if one of the current terminals is connected to the sense amplifier with the large contact area, it is necessary for the other current terminal that the margin is taken over the periphery of the element for fitting the formation of the current terminal. Therefore, the contact area is decreased, and unlike the above-described cylindrical TMR element, the detection of the read current can not be carried out with the high MR ratio and high sensitivity.

In the first embodiment, although the cylindrical TMR element having the circular and rectangular-like sections has been described, it may be possible to adopt various modifications for the sectional shape of the cylindrical TMR element. There may be also various modifications for the structure and the stacking method of the cylindrical TMR element including the fixed magnetization layer 1 and the free magnetization layer 3.

In the second to seventh embodiments, with reference to the method of connecting the fixed magnetization layer of the cylindrical TMR element to the plug, and the method of connecting the free magnetization layer of the cylindrical TMR element to the electrode and the wiring layer outside the fixed magnetization layer, various modifications can be formed by exchanging its roles each other. Furthermore, it is possible that the free magnetization layer is arranged inside the cylindrical TMR element and the fixed magnetization layer is arranged outside the cylindrical TMR element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magneto-resistance element to be used in a magnetic memory device comprising:
   a cylindrical fixed magnetization layer;
   an insulating film which covers an external surface of the fixed magnetization layer; and
   a free magnetization layer which faces the fixed magnetization layer through the insulating film and covers a surface of the insulating film,
   wherein a magnetization direction of the fixed magnetization layer is parallel to a central axis direction thereof.

2. The element according to claim 1, wherein the element is configured to be formed on a semiconductor substrate, and the central axis direction thereof is arranged to be perpendicular to a surface of the semiconductor substrate.

3. The element according to claim 1, wherein, the element further comprises a plug arranged inside the element and forming a central axis thereof.

4. The element according to claim 3, wherein the plug is a write plug when it is electrically insulated from an internal surface thereof, the plug is a common read/write plug for each of the magneto-resistance elements when it is electrically connected to the internal surface thereof.

5. The element according to claim 4, wherein one end of the plug is configured to be electrically connected to an input terminal of a sense amplifier when the plug is connected to the internal surface of the element.

6. A magnetic memory device comprising:
magneto-resistance elements each including:
   a cylindrical fixed magnetization layer;
   an insulating film which covers an external surface of the fixed magnetization layer; and
   a free magnetization layer which faces the fixed magnetization layer through the insulating film and covers a surface of the insulating film,
   wherein a magnetization direction of the fixed magnetization layer is parallel to a central axis direction thereof,
a semiconductor substrate on which each of the magneto-resistance elements is formed and which includes at least one transistor; and
a wiring layer and an electrode configured to transfer data to at least one of the magneto-resistance elements through the at least one transistor and arranged parallel to a surface of the semiconductor substrate.

7. The magnetic memory device according to claim 6, wherein the surface of each of the magneto-resistance elements is electrically insulated from the wiring layer.

8. The magnetic memory device according to claim 6, wherein the wiring layer is a write wiring layer for each of the magneto-resistance elements when the wiring layer is electrically insulated from an external surface of each of the magneto-resistance elements, the wiring layer is a common read/write wiring layer for each of the magneto-resistance elements and the electrode is a read electrode for each of the magneto-resistance elements when one of the wiring layer and the electrode is electrically connected to the external surface thereof.

9. The magnetic memory device according to claim 6, wherein the wiring layer includes first and second wiring layers formed to sandwich each of the magneto-resistance elements therebetween, the first and second wiring layers are connected to the external surface of each of the magneto-resistance elements, and the first and second wiring layers are a pair of common read/write wiring layers thereof.

10. The magnetic memory device according to claim 7, wherein the wiring layer includes first and second wiring layers formed to sandwich each of the magneto-resistance elements therebetween, and the first and second leads are a pair of write wiring layers thereof.

11. The magnetic memory device according to claim 6, wherein, when one of the wiring layer and the electrode is electrically contacted to the external surface of each of the magneto-resistance elements, the one of the wiring layer and the electrode has a shape fitted to an external surface of each of the magneto-resistance elements and to be connected to the external surface thereof.

12. The magnetic memory device according to claim 7, wherein one of the wiring layer and the electrode has a shape fitted to a shape of the external surface of each of the magneto-resistance elements covered with the insulating film and to be contacted to the external surface of the insulating film.

13. The magnetic memory device according to claim 6, wherein the wiring layer is connected to the external surface so as to be fitted to the shape of the external surface of each of the magneto-resistance elements when it is electrically connected thereto, and the wiring layer is contacted to the external surface of the insulating film so as to be fitted to the shape of the external surface of each of the magneto-resistance elements covered with the insulating film when it is electrically insulated from the external surface thereof.

14. A magnetic memory device, comprising:
magneto-resistance elements each including:
   a cylindrical fixed magnetization layer;
   an insulating film which covers an external surface of the fixed magnetization layer; and
   a free magnetization layer which faces the fixed magnetization layer through the insulating film and covers a surface of the insulating film,
   wherein a magnetization direction of the fixed magnetization layer is parallel to a central axis direction of the cylinder;
a semiconductor substrate on which each of the magneto-resistance elements is formed and which includes at least one transistor; and
a wiring layer and an electrode formed to sandwich each of the magneto-resistance elements in a vicinity of an outside thereof and to be parallel to a surface of the semiconductor substrate and configured to transfer data to at least one of the magneto-resistance elements through the at least one transistor, wherein the wiring layer is a write wiring layer for each of the magneto-resistance elements which is electrically insulated from the external surface thereof, and the electrode is a read electrode for each of the magneto-resistance elements which is electrically connected to the external surface thereof.

15. The magnetic memory device according to claim 6, wherein each magneto-resistance element is configured to be formed on a semiconductor substrate, and the central axis direction thereof is arranged to be perpendicular to a surface of the semiconductor substrate.

16. The magnetic memory device according to claim 6, wherein each magneto-resistance element further comprises a plug arranged inside the element and forming a central axis thereof.

* * * * *